United States Patent [19]

Sarner et al.

[11] Patent Number: 5,379,212

[45] Date of Patent: Jan. 3, 1995

[54] LOCKING MEMORY DEVICE

[75] Inventors: Larry W. Sarner, Loveland; David C. Beckwith, Boulder, both of Colo.

[73] Assignee: United States Voting Machines, Inc., Boulder, Colo.

[21] Appl. No.: 16,195

[22] Filed: Feb. 11, 1993

Related U.S. Application Data

[63] Continuation of Ser. No. 471,643, Jan. 29, 1990, abandoned.

[51] Int. Cl.⁶ .............................................. G06F 15/28
[52] U.S. Cl. ...................................... 364/409; 235/56; 235/386
[58] Field of Search .............. 364/409; 365/189.07, 365/195; 235/54 F, 56, 386; 377/13

[56] References Cited

U.S. PATENT DOCUMENTS

| | | | |
|---|---|---|---|
| 4,142,095 | 2/1979 | Cason et al. | 235/54 F |
| 4,982,366 | 1/1991 | Takemae | 365/189.07 |

FOREIGN PATENT DOCUMENTS

| | | | |
|---|---|---|---|
| 2607294 | 5/1988 | France | G06F 15/28 |
| 63-108600 | 5/1988 | Japan | 365/189.07 |

*Primary Examiner*—Gail O. Hayes
*Assistant Examiner*—Andrew Bodendorf
*Attorney, Agent, or Firm*—Duft, Graziano & Forest

[57] ABSTRACT

A method and apparatus for locking a memory device to prevent unauthorized data from being written to the memory device is disclosed. In a preferred embodiment an address of a memory device is selected such that when that address is selected, a "1" is written to an auxiliary memory device. This event causes the write-enable of the main memory to be disabled thereby locking the main memory device and preventing subsequent write operations thereto.

11 Claims, 1 Drawing Sheet

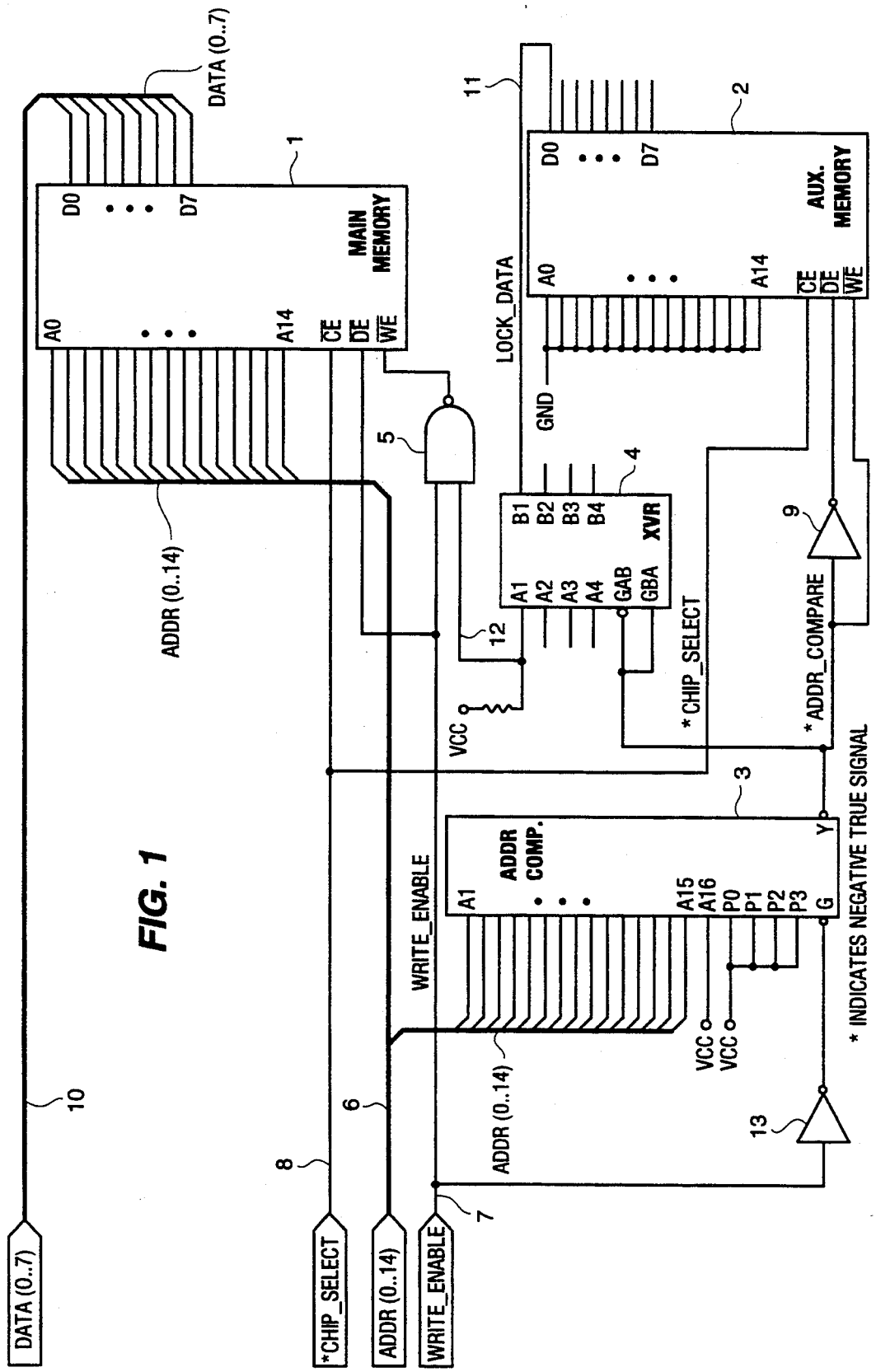

LOCKING MEMORY DEVICE

This application is a continuation, of application Ser. No. 07/471,643, filed Jan. 29, 1990, now abandoned.

FIELD OF THE INVENTION

The present invention is directed to a method and apparatus for selectively "locking" a memory circuit to prevent unauthorized data from being written to the memory circuit after the occurrence of a predetermined event.

BACKGROUND OF THE INVENTION

Memory circuits to which data may be written and stored and from which the stored data may read are widely used in a number of applications. One such application is in the field of electronic voting machines or other types of preference expression devices. Electronic voting machines may comprise at least a voting station where a voter casts votes for various candidates, referenda, etc. These votes may be recorded by storing data representative of the voter's selections in a removable tally module associated with the voting station or remote therefrom. This tally module comprises a memory device. It is very important that the data stored in this memory device be secure to preserve the integrity of the election process. In a multi-district election, e.g., the tally module from each district may be removed after the polls are closed and delivered to election authorities so that the data stored in the tally modules may be read.

Various safeguards may be implemented to protect against election fraud during the voting process. However, it is also very important to safeguard the data after the polls close so that between the time the polls close and the time the memory device is presented to the central election authorities, no unauthorized alteration of the stored data may occur.

SUMMARY OF THE INVENTION

According to one aspect of the present invention, there is provided a novel method and apparatus for preventing the unauthorized writing of data to a memory device after the occurrence of a predetermined event. In one embodiment, this event may be the closing of the polls. According to one aspect of the invention, there is provided circuitry to cause a main memory device (which may be located in a tally module) to be "locked" such that once locked, no additional data can be written to the main memory device until it is erased by external means. This locking may occur by writing data to a specified address of an auxiliary memory device which is connected to the main memory device in such a manner to render the main memory device incapable of having any additional data written to it.

BRIEF DESCRIPTION OF THE DRAWINGS

FIG. 1 is a circuit diagram of the locking memory device.

DETAILED DESCRIPTION OF THE PREFERRED EMBODIMENT

AS shown in FIG. 1, there is provided a main memory device 1, an auxiliary memory device 2, and address comparator 3, NAND gate 5, bus transceiver 4, address bus 6, write-enable line 7, chip select line 8, inverters 9 and 13, data bus 10, and data lines 11 and 12.

Main Memory device 1 may be any type of memory device capable of having data written thereto and read therefrom. Moreover, the main memory may be of any size or storage capacity. For purposes of this description, a 32K×8 EEPROM is shown. The auxiliary memory device 2 is shown as a 512×8 EEPROM, however other sizes, storage capacities and types of memories may be used. Both main memory 1 and auxiliary memory 2 have at least a chip-enable pin, a write-enable pin, an output enable pin, address pins and data pins.

On main memory 1, the chip-enable pin is connected to chip select line 8. The write-enable pin is connected to write-enable line 7 through NAND gate 5. The output-enable pin is connected to write-enable line 7. The address pins are connected to the address bus 6 and the data pins are connected to the data bus 10.

On auxiliary memory device 2, the chip-enable pin is connected to the chip select line 7. The write enable pin is connected to the output of address comparator 3. The output-enable pin is connected to the output of address comparator 3 through inverter 9. The address pins are connected to ground, effectively making the selection of address 0 permanent. Only one data pin is connected and that is connected to a data pin on the "B" side of bus transceiver 4; such connection constituting data line 11.

On address comparator 3, the function-select pin is connected to the write-enable line 7, through inverter 13; effectively allowing a signal (either low or high) to be generated on the output pin only when the write-enable is pulled high. The address lines are connected to the address bus 6. The count pins are connected to a source of a high signal, effectively making the address to be compared all ones. This compared address (all ones in the preferred embodiment) constitutes the "write-lock address". The output pin is connected to the function-select pins of the bus transceiver 4, and to the write-enable and output-enable pins of the auxiliary memory device 2 (the latter through the inverter 9).

On bus transceiver 4, the function-select pins are both connected to the output of the address comparator 3, effectively assuring that either one function or the other of the bus transceiver is selected. Only one data pin on the "B" side is connected, and that connection is to a data pin on the auxiliary memory device 2; such connection constitutes data line 11. Only one data pin on the "A" side is connected and that pin corresponds to the data pin connected on the "B" side; the connection is made from that data pin to a source of a high signal (through a high-resistance, on the order of 20,000 ohms) and to an input pin of NAND gate 5.

In operation, according to a preferred embodiment, address comparator 3 has been wired as previously described to detect the presence of the "write-lock" address on the address bus 6 by comparing the address on address bus 6 with the address "stored" in the address comparators. The initial state of each memory device (1 and 2) is "cleared" (all zeroes). Since, auxiliary memory device 2 is permanently addressed at zero in the preferred embodiment, all reading from or writing to that device will be to that single address therein. When either reading from or writing to main memory device 1, the chip select signal is brought high, and the address of the target memory location is applied to the address bus 6. When reading is desired, the write-enable line 7 is pulled low and the data may be found on data bus 10; when writing is desired, the write-enable line 7 is brought high and the data to be written is presented on data bus 10.

The direction of data transfer through the bus transceiver 4 is dependent on the output of the address comparator 3, because of the nature of the connections of that output to the GAB and GBA pins of the transceiver 4. If the output of address comparator 3 is low, data is transferred from the B side to the A side; if the output of address comparator 3 is high, data is transferred from the A side to the B side. Therefore, transceiver 4 operates as a directional controller for data line 12 (connected between NAND gate 5 and a source of a high signal) and data line 11 (connected between auxiliary memory device 2 and the B side of the bus transceiver). While in the preferred embodiment this device is shown as a bus transceiver, various other types of devices or circuits to accomplish the same function will be readily apparent to one of ordinary skill in the art.

When writing to memory device 1 is desired, and the write-enable line 7 is pulled low, the address of the desired memory location is applied to the address bus 6 of both the main memory device 1 and the address comparator 3. Because of NAND gate 5, the actual write-enable signal to the main memory device 1 is dependent upon the signal on data line 12. If the signal on data line 12 is low ("0"), the main memory device 1 will be enabled for writing and the signals on the data bus 10 will be stored in the appropriate memory location of memory device 1. If the signal on data line 12 is high ("1"), the main memory device 1 will not be enabled for writing and no action is taken within the main memory device 1.

The signal on data line 12 is dependent upon the direction of transceiver 4 and the signal on data line 11. If the transceiver 4 is selected to function from A to B, then data line 12 will go high as a "1" is simultaneously transferred across the bus transceiver 4. If transceiver 4 is selected to function from B to A, then data line 12 will have whatever signal is on data line 11. As noted before, transceiver 4 is selected to function from A to B when the output of comparator 3 is high and functions from B to A whenever the output of comparator 3 is low. Thus, main memory device 1 is only write-enabled when the output from the address comparator 3 and the signal on data line 11 are both low, (after an appropriate settling time)

As described above, the output of the address comparator a has a low signal only when the address on address bus 6 is NOT the same as the write-lock address (all ones in the preferred embodiment) simultaneously when the write-enable line is high, i.e., when an attempt is made to write to the write-lock address. In the circuit of the present invention, that same low signal causes activation of an output-enable function on the auxiliary memory device 2 thereby causing the contents of address 0 of the auxiliary memory device 2 to be presented on data line 11. While the auxiliary memory device 2 remains in its initial cleared state (all zeros), these contents are necessarily 0 and the main memory device 1 is write-enabled as just explained. Therefore, as long as the contents of auxiliary memory device 2 remain in its initial cleared state (all zeros), any address of the main memory device 1 can be written to other than the write-lock address.

However, if the address on address bus 6 is ever the same as the write-lock address, then a high signal on the output of address comparator 3 causes the bus transceiver to transfer a high signal (1) to data line 11 (i.e., A to B). The high signal on the output of address comparator 3 also causes the write-enable pen, the auxiliary memory device 2 to be high, causing the 1 on line 11 to be written to that memory. As a result, the auxiliary memory device 2 is no longer in its initial cleared state, but instead has a 1 stored therein ("set state"). It should be noted that the only way of write-enabling the auxiliary memory device 2 is by the occurrence of the above events, so there is no way of writing a 0 to the auxiliary memory device 2 and thus no way of returning it to a cleared state, save by physically erasing the memory by external means (not shown). Placing auxiliary memory device 2 in its set state constitutes activation of the locking circuit.

Since there is no way to return the auxiliary memory device to the cleared state (absent erasure), once the auxiliary memory device 2 is in the set state, the signal on line 11 is always high (1). As a result, the main memory device 1 cannot be write-enabled, as previously explained. Thus, by activation of the locking circuit the memory is permanently "locked" from all subsequent attempts to write to it until the auxiliary memory is erased by external means.

External means of erasure of the memory devices 1 and 2 are not shown, but could be accomplished either by physical removal of the devices and replacement, or by the addition of a circuit which causes writing zeroes to all memory locations in both the devices upon an appropriate externally supplied signal.

As specifically applied to an electronic voting system, the entirety of the circuit could be part of a module used to store votes cast by voters. The module could contain a housing which would allow physical access to the memory devices only in a secure manner, for example, by use of a key. During voting hours, the voting control system avoids any attempt to write to the write-lock address. When it is finally desired to lock the memory after the voting hours have passed (at the close of the polls), the controlling system deliberately would attempt to write to the write-lock address. As a result of that action, any subsequent attempt to write to the main memory would fail because of the activation of the locking circuit as described above. Any such attempts would fail regardless if made by the original controlling system or, more importantly, if made by another system. The locked state would remain in effect until physical access is made to the memory devices to erase them. Thus, after activation of the locking circuit, it is possible to erase the votes completely (in a secure manner), but it is not possible to selectively tamper with them thereby preserving the integrity of the voting process.

While the foregoing describes a preferred embodiment of the invention, it is to be understood thai the invention is not limited thereto. Various alternative embodiments will be readily apparent to one of ordinary skill in the art. For example, the use of programmable logic arrays (PLAs) or logic cell arrays (LCAs) or both may be used instead of the discrete logic described herein. Moreover, the use of PLAs or LCAs permits additional functions to be performed such as error detection and correction, controlled erasure of a memory device and control by command as opposed to control by logic (e.g., writing to a memory location). Moreover, the invention is not limited to the field of electronic voting machines. The invention is only limited by the claims appended hereto.

We claim:

1. In a voting system comprising a vote storage device, a method of preventing data from being written to said vote storage device after the occurrence of a predetermined event, said method comprising the steps of:
- comparing address information present on an address bus with a preselected address;
- generating an output signal when said address information corresponds to said preselected address;
- writing preselected data to an auxiliary memory device in response to the generation of said output signal;
- preventing data from being written to said vote storage device when said preselected data is stored in said auxiliary memory device wherein said vote storage device is located in a tally module of said voting system.

2. An apparatus for preventing unauthorized data from being written to a memory device wherein said memory device is connected to an address bus, said apparatus comprising:
- comparator means connected to said address bus for comparing address information present on said address bus with a preselected address and for generating an output signal when the address information corresponds to said preselected address;
- auxiliary memory means for storing data written thereto;
- means responsive to said output signal for causing preselected data to be written to said auxiliary memory means; and
- means for preventing data from being written to said memory device when said preselected data is stored in said auxiliary memory means and wherein said memory device is located in a tally module of a voting system.

3. An apparatus for preventing the unauthorized alteration of data stored in a main memory device, said apparatus comprising:
- an auxiliary memory device;
- an address comparator having a preselected address supplied thereto;
- an address bus connected to said address comparator and said memory device;
- wherein said address comparator compares address information located on said address bus with said preselected address and generates an output signal upon the coincidence thereof;
- further wherein said output signal causes predetermined data to be stored at a selected memory location of said auxiliary memory device;
- further wherein the presence of said predetermined data at said selected memory location of said auxiliary memory device prevents the unauthorized alteration of data stored in said main memory device and wherein said main memory device is located in a tally module of a voting system.

4. The apparatus of claim 3, wherein said main memory device is selectively capable of being write-enabled to allow data to be written thereto, further comprising:
- a logic gate having a first input selectively connected to an output of said auxiliary memory device when said comparator means does not generate said output signal, and having an output adapted for connection to said main memory; and
- a write-enable signal connected to a second input of said logic gate,
- wherein the presence of the preselected data and a write enable signal at inputs of said logic prevents said main memory device from being write-enabled.

5. The apparatus according to claim 3, further including means for preventing the unauthorized alteration of data stored in said main memory when said predetermined data is being stored in said auxiliary memory device.

6. The method according to claim 2, further comprising the step of preventing data from being written to said vote storage device during said step of writing preselected data to said auxiliary memory device.

7. The apparatus according to claim 2, further comprising means for preventing data from being written to said memory device when said preselected data is being written to said auxiliary memory means.

8. An apparatus for preventing unauthorized data from being written to a memory device wherein said memory device is connected to an address bus, said apparatus comprising:
- comparator means adapted for connection to said address bus for comparing address information on said address bus with a preselected address and for generating an output signal indicative of whether the address information is coincident with said preselected address;
- auxiliary memory means for storing data written thereto;
- control means responsive to said output signal from said comparator means for:
  - i. causing preselected data to be written to said auxiliary memory means and preventing data from being written to the memory device when the address information is coincident with said preselected address; and
  - ii. preventing data from being written to the memory device when the address information is not coincident with said preselected address and said preselected data is stored in said auxiliary memory means and wherein said memory device is located in a tally module of a voting System.

9. An apparatus according to claim 8, wherein the memory device has a write-enable function and said control means comprises:
- a logic circuit having an first input connected to a write-enable line, said logic circuit generating an output signal which controls the write-enable function of the memory means;
- switching means responsive to said output signal from said comparator means for:
  - i. connecting a predetermined signal to said auxiliary memory means and to a second input of said logic circuit when the address information is coincident with said preselected address; and
  - ii. connecting said auxiliary memory means to said second input of said logic circuit when the address information is not coincident with said preselected address; and
- writing means responsive to said output signal from said comparator means for writing predetermined data, including the predetermined signal, to said auxiliary memory means when the address information is coincident with said preselected address,
- wherein said output signal of said logic circuit deactivates the write-enable function of the memory device when said second input corresponds to said predetermined signal.

10. An apparatus according to claim 9, wherein said switching means comprises a bus transceiver.

11. An apparatus according to claim 10, wherein said logic circuit comprises a NAND gate and said writing means comprises an inverter.

* * * * *